(12) United States Patent  
Altinier et al.

(10) Patent No.: US 8,447,542 B2  
(45) Date of Patent: May 21, 2013

(54) METHOD AND DEVICE FOR MEASURING THE ELECTRIC POWER OF A UNIVERSAL ELECTRIC MOTOR POWERED BY SINUSOIDAL ALTERNATING VOLTAGE

(75) Inventors: Fabio Altinier, Codogne (IT); Terenzio Girotto, Sesto Al Regheny (IT); Marco Zordan, Padua (IT)

(73) Assignee: Electrolux Home Products Corporation N.V., Brussels (BE)

( * ) Notice: Subject to any disclaimer, the term of this patent is extended or adjusted under 35 U.S.C. 154(b) by 365 days.

(21) Appl. No.: 12/864,950

(22) PCT Filed: Dec. 19, 2008

(86) PCT No.: PCT/EP2008/011133  
§ 371 (c)(1),  
(2), (4) Date: Jul. 28, 2010

(87) PCT Pub. No.: WO2009/097891  
PCT Pub. Date: Aug. 13, 2009

(65) Prior Publication Data  
US 2010/0324843 A1    Dec. 23, 2010

(30) Foreign Application Priority Data  
Feb. 6, 2008    (EP) .................................... 08151139

(51) Int. Cl.  
*G01R 21/00*    (2006.01)

(52) U.S. Cl.  
USPC ........................................................ 702/60

(58) Field of Classification Search  
USPC ........................................................ 702/60  
See application file for complete search history.

(56) References Cited

U.S. PATENT DOCUMENTS

| 4,661,765 A | 4/1987 | Bando et al. |
| 5,517,106 A | 5/1996 | Longini |
| 5,684,377 A | 11/1997 | Kim et al. |
| 7,026,771 B2 * | 4/2006 | Kushida et al. ................. 318/98 |

FOREIGN PATENT DOCUMENTS

| DE | 103 26 785 | 12/2004 |
| EP | 0 741 450 | 11/1996 |
| EP | 1 597 995 | 11/2005 |
| KR | 2003-0063722 | 7/2003 |

OTHER PUBLICATIONS

International Search Report mailed Apr. 17, 2009 in corresponding International Application No. PCT/EP2008/011133.

* cited by examiner

*Primary Examiner* — Stephen Cherry  
(74) *Attorney, Agent, or Firm* — Banner & Witcoff, Ltd

(57) ABSTRACT

A method measures the electric power of a universal electric motor (4) connected to an electric power mains (6) by a Triac (7) and supplied by sinusoidal alternating voltage (V(t)). The method determines a first (ton) and a second (toff) instant at which the current (I(t)) supplied to the motor (4) passes from a zero value to a value other than zero. The current supplied to the motor (4) at a third instant between the first (ton) and second (toff) instant is measured. A fitting current time pattern (f(t)) approximating the real time pattern of the current (I(t)), and which has a zero current value at the first (ton) and second (toff) instant, and a current value equal to a sampled current at the third instant (tin), is determined. The mean electric power is calculated on the basis of the fitting current time pattern (f(t)).

16 Claims, 4 Drawing Sheets

METHOD AND DEVICE FOR MEASURING THE ELECTRIC POWER OF A UNIVERSAL ELECTRIC MOTOR POWERED BY SINUSOIDAL ALTERNATING VOLTAGE

BACKGROUND OF THE INVENTION

The present invention relates to a method and electronic device for measuring the electric power of a universal electric motor powered by sinusoidal alternating voltage.

To reduce production cost, some electric household appliances, such as washing machines, are equipped by the manufacturers with so-called "universal" electric motors, which have the big advantage of being powered with alternating current by particularly simple, low-cost power circuits employing Triacs, while at the same time providing similar performance as direct-current electric motors, i.e. high starting torque, compactness, high rotation speed, etc.

It should be pointed out that the term "universal motor" is used herein to indicate a wire-wound stator motor that can operate on both direct and alternating current. Alternating-current operation of the motor is made possible by the fact that, thanks to the power circuit, the electric currents in the stator and rotor of the motor are inverted simultaneously, and the relative magnetic fields work in the same way, generating the same type of attraction or repulsion force.

As is known, certain operating parameters of the appliance must be measured to permit a direct electronic control of the appliance working. More specifically, the latest washing machines normally comprise a control device that controls the electric motor by regulating its speed instant by instant to counteract, for example, any unbalance caused by the laundry in the laundry drum during the spin cycle, and so reduce walking and/or the noise level of the appliance.

Processing by the control device is substantially based on determining mechanical quantities, such as the speed and torque of the motor. More specifically, the speed of the motor is determined "directly" by a speed sensor fitted to the drive shaft, whereas mechanical torque is determined "indirectly" by processing electric parameters, such as the mean electric power of the motor.

To calculate electric power, the methods employed by the computing units of many control devices substantially comprise a complete reconstruction of the time patterns of current and voltage supply to the motor at each period, and, though determining mean electric power fairly accurately, have the drawback of requiring particularly high-computing-power units with high frequency sampling rate capability, which are complex and expensive and so greatly increase the overall production cost of the appliance.

SUMMARY OF SELECTED INVENTIVE ASPECTS

It is an object of the present invention to provide a method of measuring the mean electric power of a universal motor by means of a small number of operations, and which may therefore be implemented by simple, low-cost computing units.

According to an aspect of the present invention, there is provided a method of measuring the electric power of a universal electric motor, as claimed in claim 1 and, preferably, though not necessarily, in any one of the Claims depending directly or indirectly on claim 1.

According to another aspect of the present invention, there is provided an electronic device for determining the electric power of a universal electric motor of an electric household appliance, as claimed in claim 7 and, preferably, though not necessarily, in any one of the Claims depending directly or indirectly on claim 7.

According to yet another aspect of the present invention, there is provided an electric household appliance, as claimed in claim 8.

According to a further aspect of the present invention, there is provided a computer readable data storage medium containing instructions, as claimed in claim 9.

BRIEF DESCRIPTION OF THE DRAWINGS

A non-limiting embodiment of the present invention will be described by way of example with reference to the accompanying drawings, in which.

DETAILED DESCRIPTION OF EXAMPLE EMBODIMENTS

Figure 1:
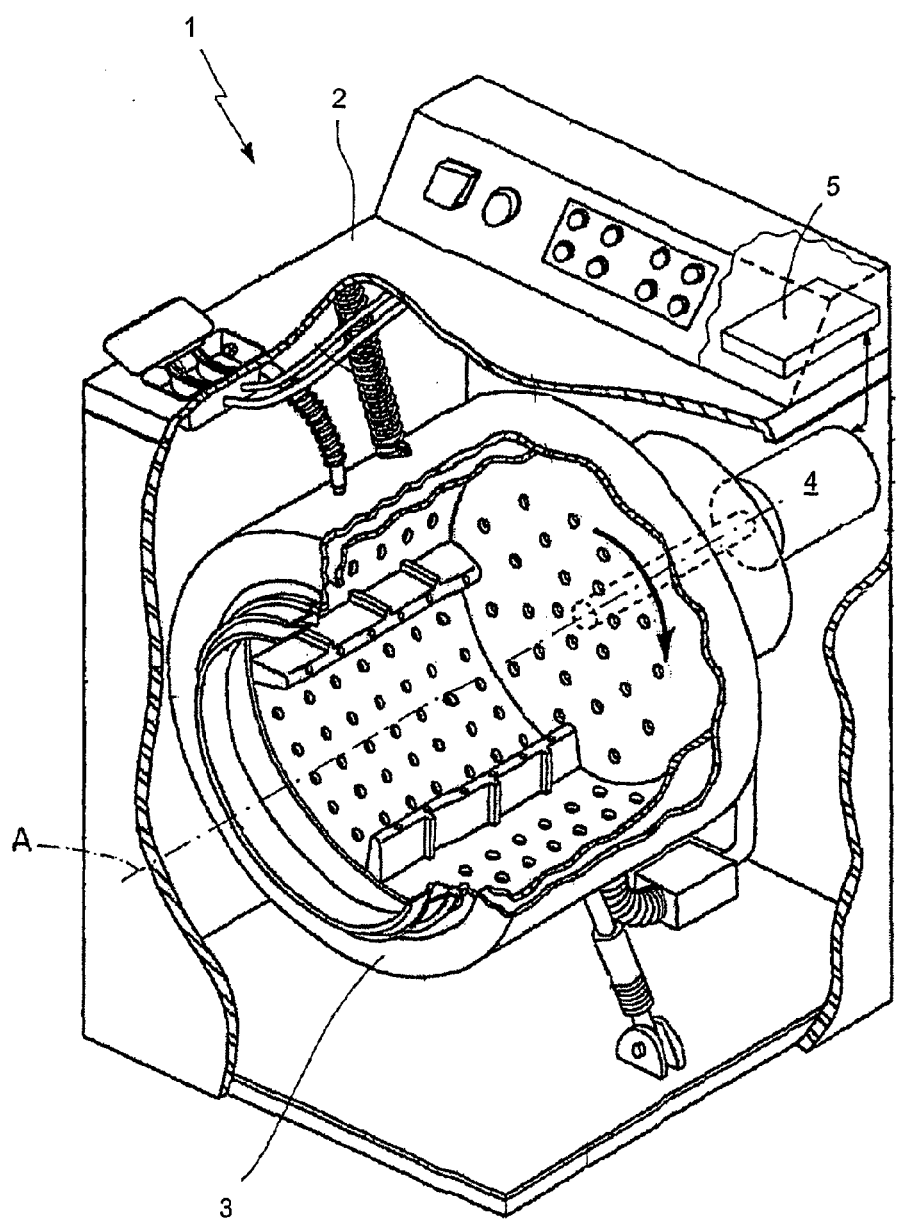
FIG. 1 shows a partly sectioned view in perspective, with parts removed for clarity, of an electric household appliance comprising a universal electric motor, and an electronic device for determining the electric power of the electric motor and in accordance with the teachings of the present invention.

Number 1 in FIG. 1 indicates as a whole an electric household appliance, in particular a home washing machine, which substantially comprises a preferably, though not necessarily, parallelepiped-shaped casing 2; and a laundry drum 3 mounted inside casing 2 to rotate freely about an axis of rotation A, and directly facing a laundry loading/unloading opening formed in a wall of casing 2.

Appliance 1 also comprises a universal electric motor 4 with its output shaft connected to laundry drum 3 by means of a transmission system to rotate it about axis of rotation A; and a control circuit 5 for controlling the speed of universal electric motor 4 by regulating its current supply.

Figure 2:
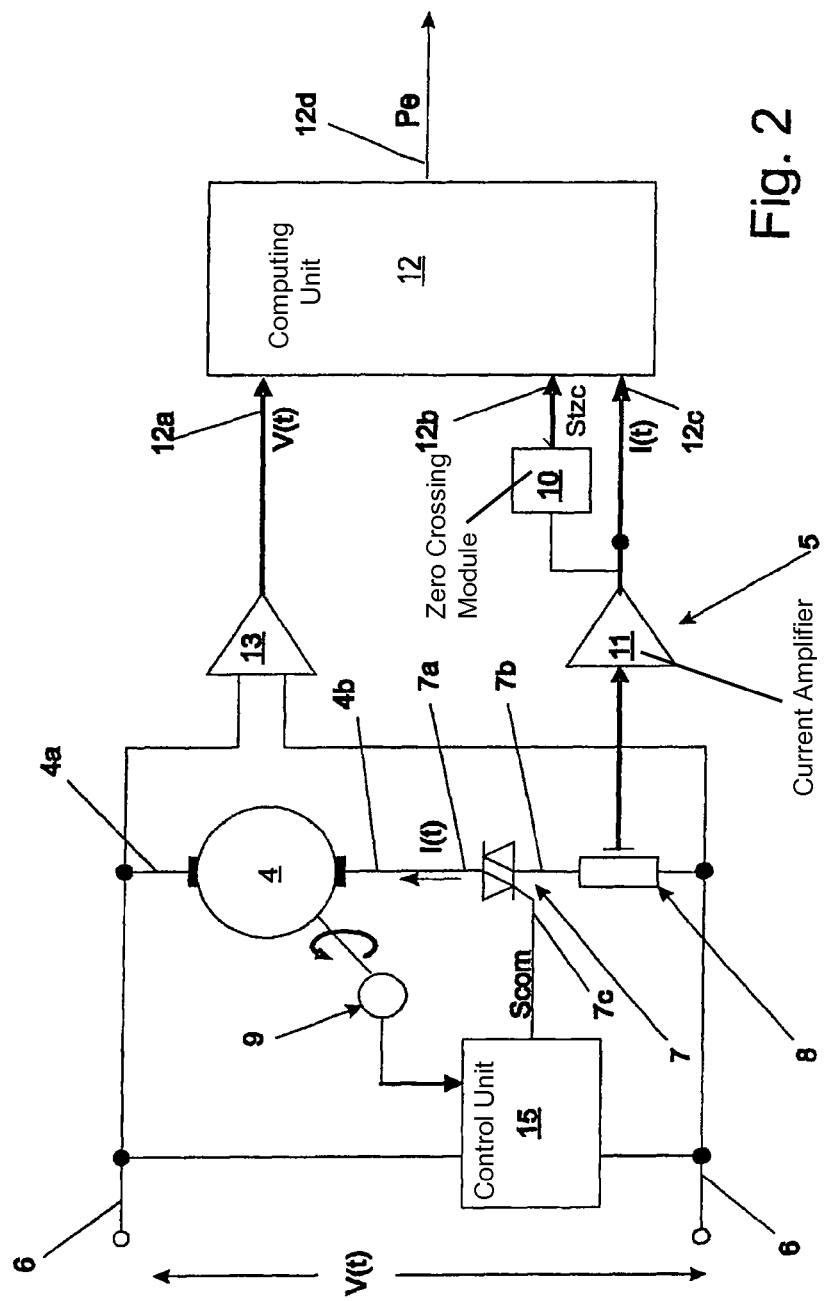
FIG. 2 shows, schematically, a control circuit of the FIG. 1 electric household appliance.

More specifically, with reference to the FIG. 2 example, universal electric motor 4 has a first and second electric terminal 4a, 4b connected to a power mains 6 to receive a sinusoidal alternating voltage V(t); and control circuit 5 comprises a two-way SCR diode, such as a Triac 7, for regulating the current I(t) supplied to electric motor 4.

In the FIG. 2 example, Triac 7 substantially comprises three terminals, two of which, 7a and 7b, are defined by its anodes and connected respectively to second terminal 4b of the motor and to a line of mains 6, and a third of which, 7c, is defined by the gate, and is supplied with a control signal Scom for turn-on biasing Triac 7. Operation of Triac 7 is known and therefore not described in detail.

Control circuit 5 also comprises a current detecting device 8, e.g. a shunt as shown in FIG. 2, connected between Triac 7 and a line of mains 6 to supply an output signal I(t) indicating the instantaneous value of the current supplied to motor 4; and a speed measuring device 9, e.g. a speedometer dynamo, located at the output shaft of motor 4 and providing an output signal indicating the angular speed of universal electric motor 4.

Figure 3:
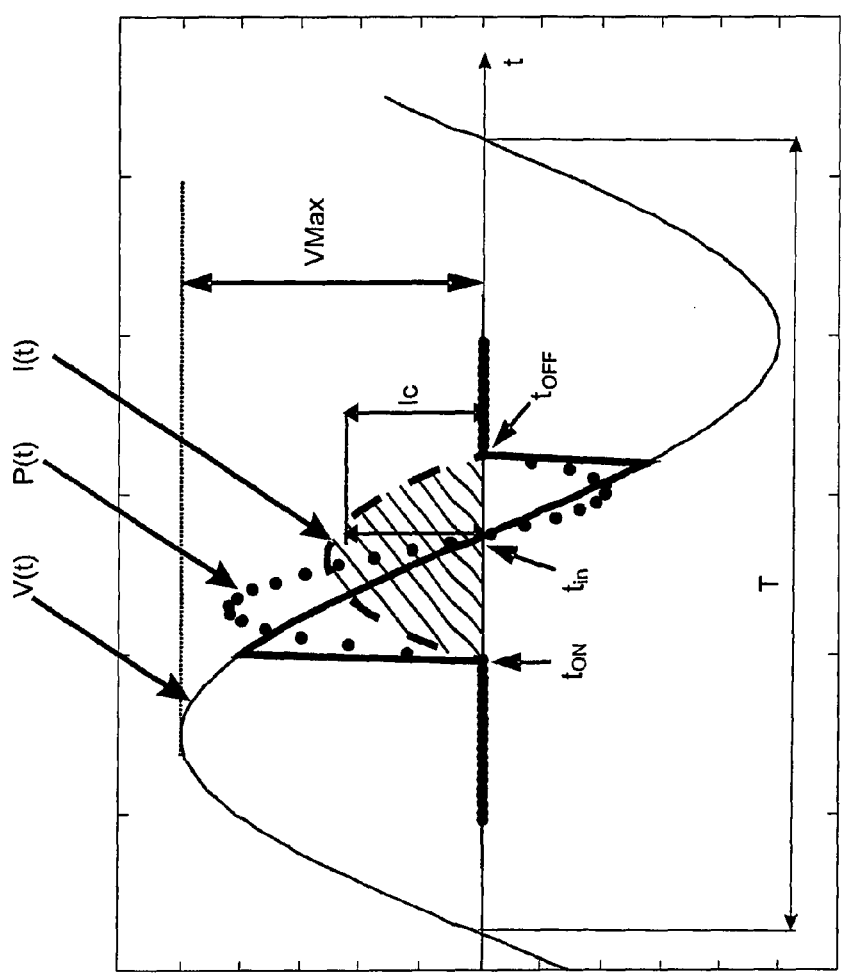
FIG. 3 shows an example time pattern of current and alternating voltage supplied to the universal electric motor by the control circuit.

Control circuit 5 also comprises a zero-crossing module 10 having a first input terminal connected to the output of current detecting device 8, preferably, though not necessarily, via a current signal amplifier 11; and an output terminal that supplies a zero-crossing signal Stzc indicating the instant in which the alternating current I(t) supplied to motor 4 is zero: I(t)=0 (FIG. 3).

With reference to FIG. 2, control circuit 5 also comprises a computing unit 12 for calculating the power of motor 4, and which comprises an input terminal 12a connected to the two lines of mains 6, preferably, though not necessarily, via a voltage amplifier 13, to receive the voltage V(t) supplied to motor 4; an input terminal 12b connected to the output of zero-crossing module 10 to receive zero-crossing signal Stzc; an input terminal 12c connected to the output of current amplifier 11 to receive signal I(t); and an output terminal 12d supplying the mean value Pe of the electric power supplied to motor 4.

Control circuit 5 also comprises a control unit 15 for controlling motor 4 and generating control signal Scom, which turns on Triac 7 during control of electric motor 4 according to the required speed of motor 4.

Figure 4:
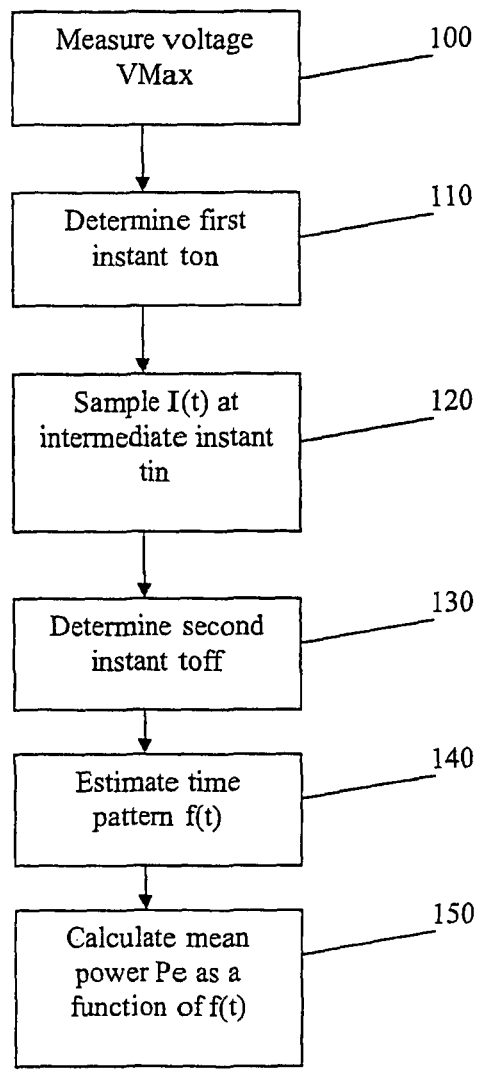
FIG. 4 shows a flow chart of the operations performed by the electronic device to calculate the electric power of the universal electric motor in FIG. 1.

FIG. 4 shows the method employed by computing unit 12 to determine the mean electric power supplied to motor 4.

More specifically, the measurement can be made during each half-period T/2 of the sinusoidal voltage V(t), from the instant ton (FIG. 3) in which Triac 7 is turned on, to the instant toff in which Triac 7 is turned off, thus cutting off current supply to motor 4.

First of all, the method provides for sampling voltage V(t) (block 100) to determine the peak value VMax of the voltage supplied to motor 4.

The method then determines the initial instant ton in which the current passes from a zero value to a value different from zero (block 110). More specifically, the initial instant ton may correspond to the instant in which control unit 15 controlling motor 4 turns Triac 7 on, i.e. the instant in which current I(t) supplied to terminals 4a and 4b of motor 4 passes from a zero value to a value different from zero.

At this point, by means of current detecting device 8, the method samples a value Ic of current I(t) at an intermediate instant tin between initial instant ton and the final instant toff.

More specifically, in the FIG. 3 example, the intermediate instant tin corresponds to the zero-crossing instant (block 120) in which voltage V(t) assumes a zero value, and current I(t) conveniently assumes a value Ic around its maximum peak Imax.

At this point, the method determines, over half-period T/2, the final instant toff in which the current passes from a value different from zero to a zero value (block 130). The final instant toff-may be determined when Triac 7 is turned off completely, by examining, for example, the zero-crossing signal Stzc supplied by zero-crossing module 10.

At this point (block 140), the method estimates a fitting current time pattern f(t) approximating the real time pattern of current I(t) supplied by Triac 7 to motor 4 in the time interval between initial instant ton and final instant toff. The estimated fitting current time pattern has a zero current value at initial instant ton and final instant toff, and a current value equal to the sampled current value Ic at intermediate instant tin.

At this stage, the method therefore estimates a waveform defined by the fitting current time pattern f(t) indicating the pattern of current I(t) supplied to the motor 4, which has a zero value at instants ton and toff, and sampled value Ic at intermediate instant tin.

More specifically, function f(t) associated with the fitting current time pattern may conveniently correspond for example to a quadratic function having a parabolic time pattern through the three points associated with the values of current I(t) at instants ton, tin, and toff.

More specifically, and for example, once three points associated with the real current time pattern are determined, i.e. P1(ton, I(t)=0), P2(tin, I(t)=Ic) and P3(toff, I(t)=0), a single parabolic curve through the three points can be determined.

At this stage, by means of a single sampling operation of current I(t) actually supplied to the motor 4 at intermediate instant tin, the method is therefore able to determine for example a parabolic curve (shown by the dash line in FIG. 3) defined by function f(t) approximating the time pattern of current I(t) actually supplied to motor 4.

At this point, the method calculates mean electric power Pe on the basis of voltage Vmax, the sampled current Ic, ton, toff, tin, according to a predetermined equation Pe(VMax, Ic).

It should be pointed out that predetermined equation Pe(Vmax, Ic) may be obtained by integrating instantaneous electric power P(t) according to the equation:

$$Pe(Vmax, Ic) = \frac{2}{T}\int_{ton}^{toff} P(t) \cdot dt = \frac{2}{T}\int_{ton}^{toff} V(t) \cdot I(t) \cdot dt. \qquad \text{a)}$$

where P(t) is the instantaneous electric power, and it is obtained by multiplying current I(t) by voltage V(t).

It should be pointed out that the mean electric power Pe may advantageously be obtained by approximating V(t) with a substantially linear function g(t) corresponding to the pattern of its portion between ton and toff. Instantaneous power P(t) may therefore be determined according to the equation P(t)≅g(t)·f(t), and the following relation is obtained:

$$Pe(Vmax, Ic) \cong \frac{2}{T}\int_{ton}^{toff} g(t) \cdot f(t) \cdot dt \qquad \text{b)}$$

Solving the above equation Pe(Vmax, Ic), and on the basis of initial instant ton, final instant toff, intermediate instant tin, sampled value Ic and Vmax, the method is able to determine the mean power. After determining the waveform defined by fitting current time pattern f(t), it is therefore possible to solve the above equation b) Pe(Vmax, Ic) and so obtain a simple formula for calculating the mean electric power Pe solely as a function of the one voltage value Vmax, the sampled current Ic, ton, toff and tin. After estimating the waveform defined by fitting current time pattern f(t), it is therefore possible to determine the formula to evaluate Pe(Vmax, Ic), which, implemented by computing unit 12, provides for determining mean electric power Pe solely as a function of peak voltage VMax, sampled current Ic, ton, toff and tin.

To measure mean electric power more accurately, the number of sampling operations performed in the interval between ton and toff may obviously be greater than one but less then ten, so as to maintain limited the number of operations implemented by computing unit 12.

Once mean electric power Pe is determined, the method may advantageously determine, by means of known algorithms not described in detail, other mechanical parameters of the electric motor, such as mechanical power, torque or inertia, and process them to control, for example, unbalance of the washing machine.

The device and method described have the advantage of being extremely easy, and therefore cheap, to implement. More specifically, the method provides for determining mean electric power by means of a current approximation substantially involving only one sampling operation of the current supplied to the motor over a half-period, and simultaneously determining the two zero-current instants over the half-period. Given the low sampling speed involved, extremely simple computing units of only modest computing power, and hence low cost, may therefore be used. This is also made possible by linear approximation of the alternating-voltage time pattern over the ton-toff interval considered, when directly calculating instantaneous power.

Clearly, changes may be made to the device, method, and electric household appliance 1 as described herein without, however, departing from the scope of the present invention as defined in the accompanying Claims.

The invention claimed is:

1. A method of measuring the electric power of a universal electric motor connected to an electric power mains by a switch; said electric power mains supplying said motor with a substantially sinusoidal alternating voltage (V(t)); at half-periods of said voltage (V(t)), said switch being turned on at a first instant (ton) and turned off at a second instant (toff), which are established as a function of a current (I(t)) to be supplied to said motor; said method comprising the steps of:
   sampling the current (I(t)) supplied to said motor, at at least a third instant (tin) between said first and said second instants, to determine a corresponding sampled current value (Ic);
   estimating a fitting current time pattern (f(t)) having a zero current value at said first (ton) and said second (toff) instants, and a current value (I(tin)) equal to said sampled current value (Ic) at said at least a third instant (tin);
   calculating a measure of electric power on the basis of the estimated said fitting current time pattern (f(t)).

2. A method as claimed in claim 1, wherein said at least a third instant (tin) corresponds to an instant at which said voltage (V(t)) has a zero value.

3. A method as claimed in claim 1, and comprising the step of measuring the peak value (VMax) of said voltage (V(t)).

4. A method as claimed in claim 3, wherein said measure of electric power is calculated on the basis of said fitting current time pattern (f(t)) and the peak value (VMax) of said voltage (V(t)).

5. A method as claimed in claim 4, wherein said measure of electric power is a measure of mean electric power (Pe).

6. A method as claimed in claim 1, wherein said fitting current time pattern (f(t)) corresponds to a polynomial function.

7. A method as claimed in claim 1, wherein said switch comprises a Triac.

8. An electronic device for measuring the electric power of a universal electric motor connected to an electric power mains by a switch; said electric power mains supplying said motor with a substantially sinusoidal alternating voltage (V(t)); at half-periods of said voltage (V(t)), said switch being turned on at a first instant (ton) and turned off at a second instant (toff), which are established as a function of the current (I(t)) to be supplied to said motor; and said electronic device comprising computing means configured to:
   sample the current (I(t)) supplied to said motor, at least a third instant (tin) between said first and said second instant, to determine a corresponding sampled current value (Ic);
   estimate a fitting current time pattern (f(t)) having a zero current value at said first (ton) and said second (toff) instant, and a current value of (I(tin)) equal to said sampled current value (Ic) at said at least third instant (tin); and
   calculate a measure of electric power on a basis of the estimated said fitting current time pattern (f(t)).

9. An electronic device as claimed in claim 8, wherein said measure of electric power is a measure of mean electric power (Pe).

10. An electronic device as claimed in claim 8, wherein said switch comprises a Triac.

11. An electric household appliance comprising a casing, a laundry drum mounted to rotate freely about a longitudinal axis of rotation inside said casing, and a universal electric motor for rotating said laundry drum about said axis of rotation; said universal electric motor being connected to an electric power mains by a switch; said electric power mains supplying said universal electric motor with a substantially sinusoidal alternating voltage (V(t)); at half-periods of said voltage (V(t)), said switch being turned on at a first instant (ton) and turned off at a second instant (toff), which are established as a function of the current (I(t)) to be supplied to said universal electric motor; and said electric household appliance comprising an electronic device for measuring the electric power of said universal electric motor and as claimed in claim 8.

12. A non-transitory computer readable data storage medium containing instructions loadable into a memory of electronic computing means and designed to implement, when executed by said computing means, a method comprising the steps of:
   sampling a current (I(t)) supplied to a motor, at at least a third instant (tin) between a first instant (ton) wherein said current is switched on and a second instant (toff) when the current is switched off, to determine a corresponding sampled current value (Ic);
   estimating a fitting current time pattern (f(t)) having a zero current value at said first (ton) and said second (toff) instants, and a current value (I(tin)) equal to said sampled current value (Ic) at said at least third instant (tin); and
   calculating a measure of electric power on the basis of the estimated said fitting current time pattern (f(t)).

13. A non-transitory computer readable data storage medium containing instructions as claimed in claim 12, wherein said measure of electric power is a measure of mean electric power (Pe).

14. A non-transitory computer readable data storage medium containing instructions as claimed in claim 12, wherein said method further comprises the step of measuring the peak value (VMax) of said voltage (V(t)).

15. A non-transitory computer readable data storage medium containing instructions as claimed in claim 14, wherein said measure of electric power is calculated on the basis of said fitting current time pattern (f(t)) and the peak value (VMax) of said voltage (V(t)).

16. A non-transitory computer readable data storage medium containing instructions as claimed in claim 12, wherein said fitting current time pattern (f(t)) corresponds to a polynomial function.

* * * * *